(12) United States Patent
Nelson et al.

(10) Patent No.: US 9,721,828 B2
(45) Date of Patent: Aug. 1, 2017

(54) METHOD TO REDUCE PARTICLES DURING STI FILL AND REDUCE CMP SCRATCHES

(71) Applicant: Texas Instruments Incorporated, Dallas, TX (US)

(72) Inventors: Andrew Brian Nelson, Melissa, TX (US); Richard A. Stice, Plano, TX (US); Joe Tran, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/559,268

(22) Filed: Dec. 3, 2014

(65) Prior Publication Data

US 2015/0187635 A1    Jul. 2, 2015

Related U.S. Application Data

(60) Provisional application No. 61/921,934, filed on Dec. 30, 2013.

(51) Int. Cl.
*H01L 21/762* (2006.01)
*H01L 21/02* (2006.01)
*H01L 21/3105* (2006.01)

(52) U.S. Cl.
CPC .. *H01L 21/76224* (2013.01); *H01L 21/02164* (2013.01); *H01L 21/02266* (2013.01); *H01L 21/02271* (2013.01); *H01L 21/02274* (2013.01); *H01L 21/02362* (2013.01); *H01L 21/31053* (2013.01)

(58) Field of Classification Search
CPC ......... H01L 21/02266; H01L 21/02362; H01L 21/02271; H01L 21/76224
See application file for complete search history.

(56) References Cited

U.S. PATENT DOCUMENTS

| | | | |
|---|---|---|---|
| 6,426,272 B1* | 7/2002 | Fu et al. | 438/435 |
| 2003/0077888 A1* | 4/2003 | Lee | C23C 16/045 438/582 |
| 2009/0068817 A1* | 3/2009 | Eun | 438/425 |
| 2010/0224876 A1* | 9/2010 | Zhu | H01L 21/76898 257/52 |
| 2011/0151678 A1* | 6/2011 | Ashtiani | H01L 21/76224 438/786 |
| 2012/0086084 A1* | 4/2012 | Kikuchi | H01L 21/82384 257/369 |
| 2012/0108021 A1* | 5/2012 | Mehrotra | 438/231 |
| 2013/0193548 A1* | 8/2013 | Kim | 257/506 |
| 2013/0319543 A1* | 12/2013 | Wang | H01L 21/67161 137/334 |

* cited by examiner

*Primary Examiner* — Charles Garber
*Assistant Examiner* — Brigitte Paterson
(74) *Attorney, Agent, or Firm* — Jacqueline J. Garner; Charles A. Brill; Frank D. Cimino

(57) ABSTRACT

A method of filling STI trenches with dielectric with reduced particle formation. A method of depositing unbiased STI oxide on an integrated circuit during STI trench fill that reduces STI defects during STI CMP.

14 Claims, 3 Drawing Sheets

METHOD TO REDUCE PARTICLES DURING STI FILL AND REDUCE CMP SCRATCHES

CROSS-REFERENCE TO RELATED APPLICATIONS

This application claims the benefit of priority under U.S.C. §119(e) of U.S. Provisional Application 61/921,934.

FIELD OF INVENTION

This invention relates to the field of integrated circuits. More particularly, this invention relates to shallow trench isolation in integrated circuits.

BACKGROUND

As circuit densities increase, the width of shallow trench isolation (STI) trenches decreases while the depth of these trenches remains almost constant. This results in an increased aspect ratio that becomes progressively more difficult to fill without leaving voids.

One method of filling high aspect ration shallow trench isolation (STI) trenches is a chemical vapor deposition (CVD) technique such as high density plasma (HDP) oxide or high aspect ratio (HARP) oxide which employ a deposition/etch/deposition (dep/etch/dep) process. This process involves sequentially depositing material, etching some of it back, and depositing additional material. The etching step reshapes the partially filled trench, opening it at the top so that more material can be deposited before it closes up leaving an interior void.

A primary failure mode for integrated circuits which employ a dep/etch/dep STI fill process is due to STI scratches during the chemical mechanical polish (CMP) planarization process. The scratches are caused by particles formed during the dep/etch/dep STI fill process and also by particles formed when STI geometries break off during the CMP process. The particles formed during deposition or formed when STI geometries break off may get trapped in the CMP pad causing scratches. These scratches may destroy integrated circuit geometries causing yield loss and may also result in deformed integrated circuit patterns during subsequent photolithography steps due to defocus over the particle topography.

SUMMARY

STI trenches are filled with STI dielectric using a method that reduces particle formation. Unbiased STI oxide is deposited on an integrated circuit during STI trench fill to reduce STI defects during STI CMP.

DETAILED DESCRIPTION OF EXAMPLE EMBODIMENTS

Figure 1:
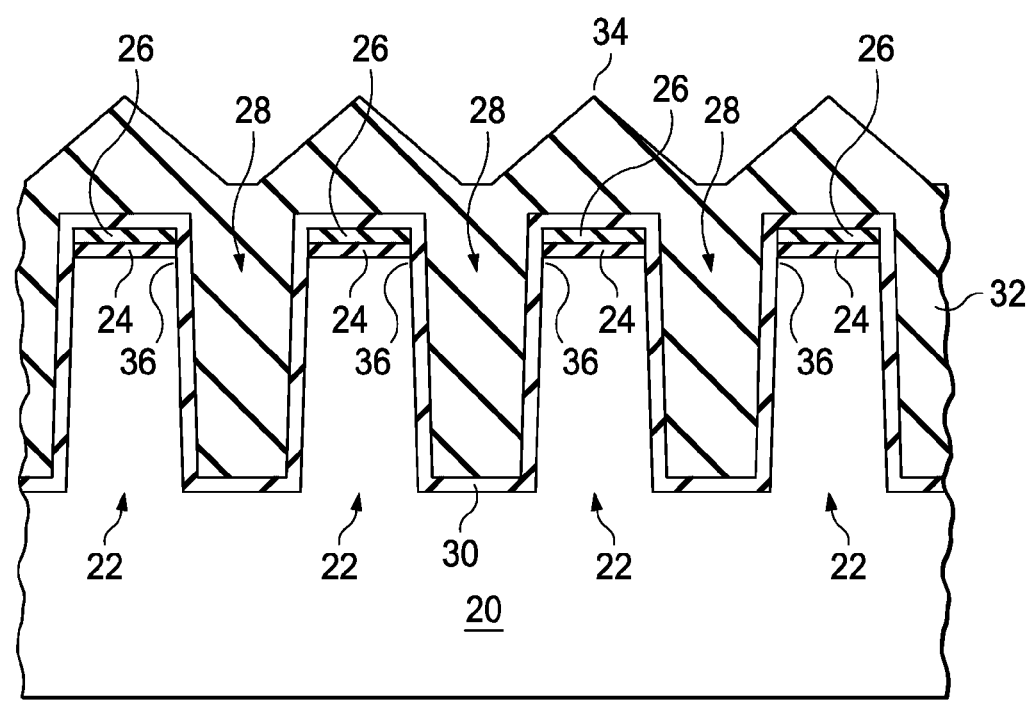
FIG. 1 (Prior art) is a cross-section of STI trenches filled using a conventional dep/etch/dep process.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the following sputter CVD deposition refers to CVD deposition with a substrate bias turned on. While the CVD film is depositing, the substrate bias accelerates ions toward the surface of the growing CVD film sputtering some of it away. Since upper surface of the integrated circuit and top corners of STI trenches sputter faster than the film at the bottom and inside the STI trenches, the thickness of the CVD film inside the STI trench grows faster than the CVD film on the surface of the integrated circuit.

FIG. 1 shows a cross section of a portion of an integrated circuit with closely spaced, high aspect ratio, trenches after filling of the shallow trench isolation (STI) trenches with dielectric deposited using a dep/etch/dep process. The STI trenches 28 are formed in a semiconductor substrate 20. The trenches 28 electrically isolate active areas 22 where transistors and other electrical devices are formed. A typical STI manufacturing process is to grow or deposit pad oxide layer 24 on the substrate 20 and then deposit a silicon nitride layer 26 on the pad oxide 24. An active photoresist pattern is then formed on the silicon nitride layer 26. The nitride 26 and pad oxide 24 layers are etched. STI trenches 28 are then etched into the substrate 20. A thin (5 nm to 15 nm) dielectric (usually silicon dioxide) is then thermally grown or deposited on the exposed semiconductor surface prior to filling the trench with a dielectric 32 such as a high density plasma (HDP) oxide or high aspect ratio plasma (HARP) oxide. During the deposition the wafer chuck upon which the wafer rests is biased with RF to cause ions in the plasma to sputter the surface of the growing dielectric film. Since the dielectric on the upper surfaces of the integrated circuit and the trenches sputters faster than dielectric in the bottom of the trenches, the dielectric thickness in the bottom of the trenches grows faster than the dielectric thickness on the top surfaces. The sputter component during the CVD deposition step is insufficient to prevent the top of the trench from closing off and trapping a void, so periodically during the STI fill step, the CVD deposition gases are turned off and plasma sputter etching is continued to reshape the partially filled trench. The additional sputter etching opens the top of the trench so that more CVD dielectric may be deposited without forming a trapped void. By repeating sputter CVD deposition and sputter etching steps, high aspect ratio STI trenches may be filled void free. To prevent the sputter etch component from damaging the top active corners 36 of the STI trench resulting in increased leakage current, typically a thin layer of unbiased dielectric 30 is first deposited with the sputtering component (substrate bias) turned off. This thin layer 30 protects the top active corners 36 of the STI trench from damage during subsequent sputter CVD deposition and sputter etching steps.

Typically the final step in a dep/etch/dep STI fill process is a sputter CVD deposition step. The final topography of a typical dep/etch/dep STI fill process is illustrated in FIG. 1. The sputter CVD deposition step leaves sharply pointed geometries 34 over narrow active geometries 22. These sharply pointed geometries 34 may break off (rip outs) during the CMP process forming particles. These particles may get trapped under or in the CMP polishing pad and may cause CMP scratches reducing yield.

Figure 2:
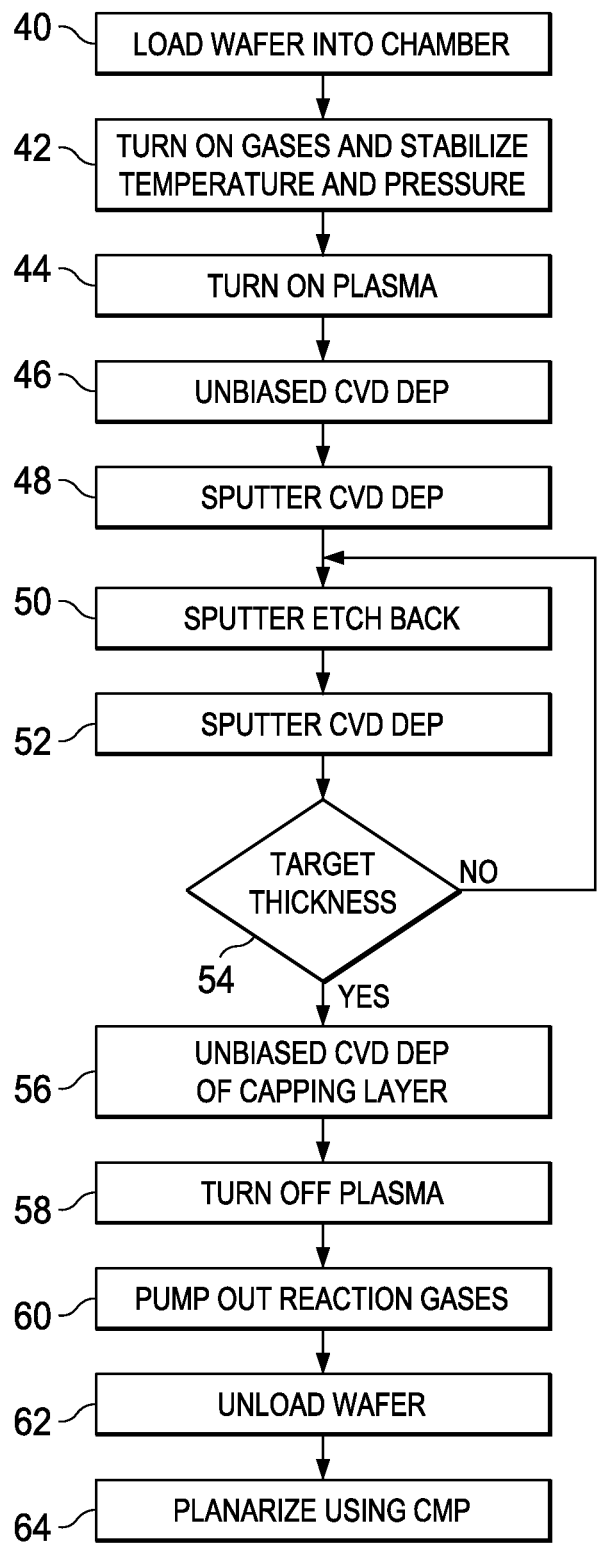
FIG. 2 is a process flow illustrating the steps in the STI dielectric deposition in an integrated circuit formed according to principles of the invention.
Figure 3:
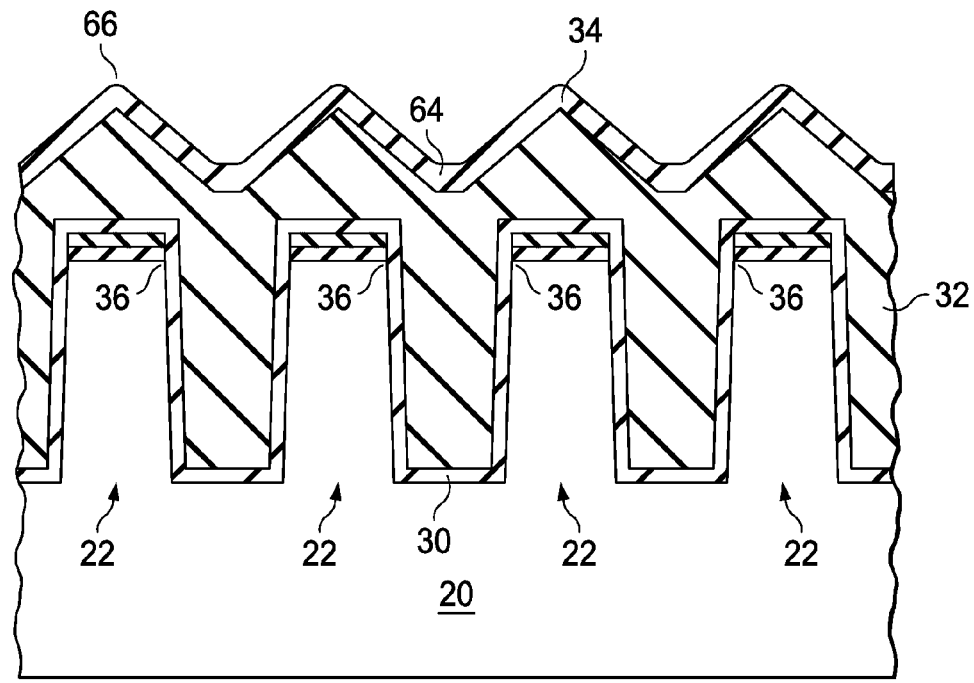
FIG. 3 is a cross-section of STI trenches filled using a process according to an embodiment of the principles of the invention.

An embodiment STI fill process which significantly reduces particle formation during the STI trench fill and due to rip outs during the STI CMP process is illustrated in FIG. 2 and FIG. 3. When an unbiased capping layer 64 (FIG. 3) is deposited over a layer which is deposited using sputter CVD deposition 32, the sharp points 34 produced by the sputter CVD deposition step are smoothed 66. This reduces the topography going into CMP and significantly reduces particle formation due to ripouts.

An unexpected result of depositing an unbiased capping layer 64 at the end of the dep/etch/dep STI fill process is that particle generation during the STI fill process is also significantly reduced. This unexpected reduction in particle formation in the STI dielectric deposition chamber enables more production wafers to be processed through the chamber between process maintenance chamber cleans and also allows more wafers to be processed through the deposition chamber between insitu chamber cleans. This improves wafer throughput and also chamber up time significantly reducing processing cost.

The embodiment process starts at step 40 in FIG. 2 with loading the wafer with the STI trenches into the deposition chamber. In step 42 process gases are introduced into the deposition chamber and stabilized prior to turning on the plasma in step 44.

In the first unbiased STI oxide deposition step 46, the RF to the substrate bias is turned off (unbiased) so that no sputtering occurs. This avoids damage that otherwise may occur on the top active corners 36 (FIG. 3) of the STI trench during subsequent sputter CVD deposition and STI sputter etching steps.

In step 48 the bias to the substrate is turned on (biased deposition) and biased STI dielectric is deposited using sputter CVD deposition. Since the dielectric on the upper surfaces of the integrated circuit and the top corners of the STI trenches sputter faster than dielectric in the bottom of the STI trenches, the dielectric thickness in the bottom of the STI trenches grows faster than the dielectric thickness on the top corners and top surfaces. In an example embodiment the deposition gases are $SiH_4$, $O_2$, He, and $H_2$;

The sputter component during the deposition step 48 may be insufficient to prevent the top of the STI trench from closing off and trapping a void so the deposition gases are turned off and sputter etching is continued in step 50. The sputter etch 50 removes STI dielectric from the top corners of the trench 36 (FIG. 3) increasing the opening at the top of the trench. This enables additional STI dielectric to be deposited during subsequent sputter deposition steps 52 without trapping a void. In an example embodiment $SiH_4$ is turned off to stop deposition during the STI sputter etch step.

As indicated in step 54, the STI sputter etchback and sputter CVD deposition steps 50 and 52 may be repeated as many times as required to fill the STI trench to the required thickness.

In step 56, once the required thickness is achieved, the bias to the substrate is turned off and an unbiased STI dielectric capping layer 64 (FIG. 3) is deposited. The unbiased capping layer 64 thickness may be deposited to a thickness in the range of 10 nm to 700 nm. In an example embodiment the deposition gases are $SiH_4$, $O_2$, He, and $H_2$; the STI dielectric is unbiased STI oxide, the deposition time is 7.8 sec; and the deposition thickness 300 A.

In step 58, the after deposition of the unbiased capping layer 64, the plasma is turned off In step 60 the reaction gasses are evacuated from the chamber and the chamber is returned to atmospheric pressure.

In step 62 the wafer unloaded from the deposition chamber and then loaded into CMP equipment.

Figure 4:
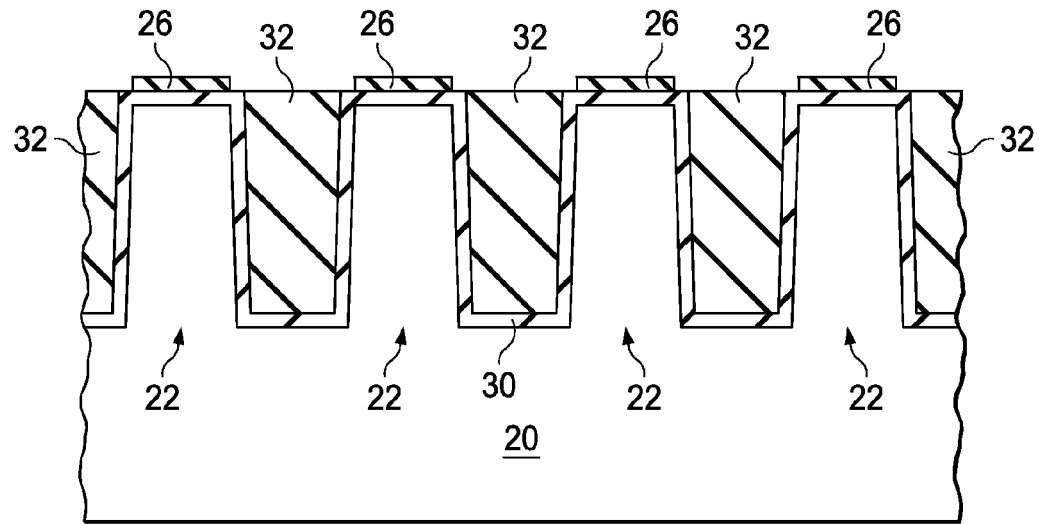
FIG. 4 is a cross-section of STI trenches filled using a process according to an embodiment of the principles of the invention.

In step 64 as is illustrated in FIG. 4, the wafer is polished using CMP and stopping on the STI nitride layer 26. The surface of the STI fill dielectric 32 is planarized. Once the formation of the STI structures is complete, processing continues with the formation of transistors and other devices and interconnect levels.

The original purpose of depositing the unbiased capping layer 64 was to modify the surface of the STI dielectric to reduce CMP scratches during CMP planarization. The unbiased capping layer 64 in FIG. 3 forms a rounded surface 66 over the sharp peaks 34 that are formed during sputter CVD deposition such as in steps 48 and 52. This rounding 66 of the sputter CVD deposition peaks significantly reduces the formation of particles due to ripouts (peaks breaking off) during CMP significantly reducing CMP scratches.

An unexpected benefit of depositing an unbiased capping layer 64 by turning off the substrate bias prior to turning off the plasma in step 58 is that particle formation in the deposition chamber is also dramatically reduced. This enables more production wafers to be processed in between chamber cleans and enables more production wafers to be processed in between preventive maintenance (PM) chamber disassembly and cleans. The wafer throughput is significantly improved reducing processing cost.

In an example embodiment, addition of the unbiased STI oxide capping layer 64 deposition step 56 after the STI dep/etch/dep dielectric fill process reduced particle formation in the deposition chamber by over 50%.

Those skilled in the art to which this invention relates will appreciate that many other embodiments and variations are possible within the scope of the claimed invention.

What is claimed is:

1. A process of forming an integrated circuit, comprising the steps:
    providing a partially processed integrated circuit wafer with shallow trench isolation (STI) trenches wherein the STI trenches lie between active geometries and wherein the active geometries are covered with a silicon nitride layer;
    loading the partially processed integrated circuit wafer into an oxide CVD deposition chamber with a sequential sputter CVD deposition/sputter etch/sputter CVD deposition process capability;
    turning on oxide deposition gases and stabilizing a temperature and pressure wherein the oxide deposition gases include SiH4, O2, and H2 and a carrier gas;
    turning on a plasma and depositing a first layer of STI oxide with a substrate bias turned off;

turning on the substrate bias and filling the STI trenches with a first portion of a second layer of STI oxide;

turning off the SiH$_4$ and sputter etching a top surface of the first portion of the second layer of STI oxide;

turning on the SiH$_4$ and depositing a second portion of the second layer of STI oxide;

repeating the steps of depositing the second layer of STI oxide and sputter etching until the shallow trench isolation trenches are filled with the second layer of STI dielectric;

turning off the substrate bias and depositing a third layer of STI oxide wherein the third layer of STI oxide is a capping layer on the second layer of STI oxide;

after depositing the third layer of STI oxide, removing the wafer from the CVD chamber; and planarizing the first, second, and third layers of STI oxide using chemical mechanical polish to remove the first, second and third layers of STI oxide from the silicon nitride layer and forming a planar surface on the integrated circuit.

2. The process of claim 1 wherein sharp peaks are formed after the STI trenches are filled with the second layer of STI oxide over the active geometries that have a minimum width and wherein the surface of the capping layer is rounded where the capping layer overlies the sharp peaks.

3. The process of claim 1 where the capping layer has a thickness of 30 nm.

4. The process of claim 1 where carrier gas is He.

5. The process of claim 1 where the second layer of STI oxide is deposited using a HDP process.

6. The process of claim 1 where the second layer of STI oxide is deposited using a HARP process.

7. A process of forming an integrated circuit, comprising the steps:

loading a wafer, with shallow trench isolation (STI) trenches wherein the STI trenches lie between active geometries and wherein the active geometries are covered with a silicon nitride layer, into a CVD chamber;

turning on oxide deposition gases, including SiH$_4$;

turning on a plasma and depositing a first layer of STI oxide with a substrate bias turned off;

turning on the substrate bias and partially filling the STI trenches with a first portion of a second layer of STI oxide;

turning off the SiH$_4$ and sputter etching a top surface of the first portion of the second layer of STI oxide;

turning on the SiH$_4$ and depositing a second portion of the second layer of STI oxide;

repeating the steps of depositing the second layer of STI oxide and sputter etching until the shallow trench isolation trenches are filled with the second layer of STI dielectric;

turning off the substrate bias and depositing a third layer of STI oxide wherein the third layer of STI oxide is a capping layer on the second layer of STI oxide;

after depositing the third layer of STI oxide, removing the wafer from the CVD chamber; and planarizing the first, second, and third layers of STI oxide using chemical mechanical polish to remove the first, second and third layers of STI oxide from the silicon nitride layer and forming a planar surface on the integrated circuit.

8. The process of claim 1 wherein sharp peaks are formed after the STI trenches are filled with the second layer of STI oxide over the active geometries that have a minimum width and wherein the surface of the capping layer is rounded where the capping layer overlies the sharp peaks.

9. The process of claim 7 wherein the capping layer has a thickness of between 10nm and 700 nm.

10. The process of claim 7 wherein the capping layer has a thickness of 30 nm.

11. The process of claim 7, wherein the oxide deposition gases include SiH4, O2, and H2 and a carrier gas.

12. The process of claim 11, wherein carrier gas is He.

13. The process of claim 7, wherein the second layer of STI oxide is deposited using a HDP process.

14. The process of claim 7, wherein the second layer of STI oxide is deposited using a HARP process.

* * * * *